United States Patent [19]

Ong et al.

[11] Patent Number: 5,783,485
[45] Date of Patent: Jul. 21, 1998

[54] PROCESS FOR FABRICATING A METALLIZED INTERCONNECT

[75] Inventors: T. P. Ong; Robert W. Fiordalice; Ramnath Venkatraman; Elizabeth J. Weitzman, all of Austin, Tex.

[73] Assignee: Motorola, Inc., Schaumburg, Ill.

[21] Appl. No.: 684,069

[22] Filed: Jul. 19, 1996

[51] Int. Cl.$^6$ .................................................. H01L 21/44
[52] U.S. Cl. ..................... 438/637; 438/666; 438/625; 438/700; 438/644; 438/633
[58] Field of Search .................................. 437/194, 195; 438/637, 625, 633, 640, 643, 653, 666, 668, 672, 700, 644

[56] References Cited

U.S. PATENT DOCUMENTS

| | | | |
|---|---|---|---|
| 4,582,563 | 4/1986 | Hazuki et al. | 156/643 |
| 4,710,398 | 12/1987 | Homma et al. | 437/235 |
| 5,227,191 | 7/1993 | Nagashima et al. | 427/97 |
| 5,305,519 | 4/1994 | Yamamoto et al. | 29/852 |
| 5,328,873 | 7/1994 | Mikoshiba et al. | 437/187 |
| 5,403,779 | 4/1995 | Joshi et al. | 437/190 |
| 5,578,523 | 11/1996 | Fiordalice et al. | 437/190 |
| 5,612,254 | 3/1997 | Mu et al. | 437/195 |

FOREIGN PATENT DOCUMENTS

| | | | |
|---|---|---|---|
| 0 211 318 A1 | 7/1986 | European Pat. Off. | H01L 21/60 |
| 3034-900 | 4/1981 | Germany . | |
| 56-40260 | 4/1981 | Japan . | |
| 59-92537 | 5/1984 | Japan . | |

OTHER PUBLICATIONS

Amazawa et al., "A 0.25µ m Via Plug Process Using Selective CVD Aluminum for Multilevel Interconnection," IEEE 1991, 10.1.1–10.1.4., pp. 265–268.
Tsubouchi et al., "Selective AL CVD on Hydrogen–Terminated Si Surface," IEEE 1991, 10.2.1–10.2.4, pp. 269–272.
Matsumiya et al., "Chemical-Vapor Deposition Technques of Al for Direct Growth on Oxidized Si and High-Speed Growth," Jpn. J. Appl. Phys. vol. 24, 1995, pp. L17–119.
Wilson et al., "A Comparison of A Two Layer Metal System Built with Selective CVD W Plugs and Elevated Temperature, Sputtered Al(Cu)," IEEE 1989, p. 493.
Zhu et al., "Selective Aluminum CVD for Sub-Micron Via Plug Filling," Mat. Res. Soc. Symp. Proc. vol. 260, 1992, pp. 125–130.

*Primary Examiner*—Caridad Everhart
*Attorney, Agent, or Firm*—Jeffrey S. Abel

[57] ABSTRACT

A process for fabrication of a metallized interconnect structure includes the formation of an inlaid interconnect (42) overlying an aluminum layer (34). The inlaid interconnect (42) is formed within an interlevel dielectric layer that is processed to contain an interconnect channel (24) and a via opening (14) residing at the bottom of the interconnect channel (24). The aluminum layer (34) is selectively deposited to at least partially fill the via opening (14) at the bottom of an interconnect channel (24). An adhesion layer (36) is deposited to overlie the aluminum layer (34) within the via opening (14), and a second aluminum layer (38) is blanket deposited and planarized to form the inlaid interconnect (42) in the interconnect channel (24).

16 Claims, 3 Drawing Sheets

PROCESS FOR FABRICATING A METALLIZED INTERCONNECT

FIELD OF THE INVENTION

This invention relates, in general, to a method for fabricating a semiconductor device, and more particularly, to a method for fabricating a metallized interconnect having high-aspect-ratio vias.

BACKGROUND OF THE INVENTION

As semiconductor integrated circuits become more complex the feature sizes of individual components are continually being reduced. In addition to feature size reduction, multiple layers of metal interconnects are used to electrically connect the various components of the integrated circuit. The evolution of semiconductor device technology toward smaller features together with the use of multiple metal layers makes the fabrication of state-of-the-art integrated circuits more difficult. Complex fabrication technology is needed to produce electrical interconnect structures having low electrical resistance and continuous electrical pathways.

To accommodate the numerous electrical interconnects which must be formed to an ever increasing number of device components, the contact and via openings formed in interlevel dielectric layers must have a very small diameter. Presently, via openings are fabricated with diameters of one micron or less. While the diameter must be reduced to accommodate the increased number of interconnects, the thickness of the dielectric layer separating the various levels of interconnect layers cannot be decreased without risk of reduced device performance. This has the effect of increasing the aspect ratio of the via openings. The aspect ratio is defined as the depth of the contact opening versus the diameter of the contact opening. In state-of-the-art devices, aspect ratios of 2 to 1, or greater, are commonly encountered. Small diameter openings created in a thick dielectric layer result in the formation of high-aspect-ratio contact openings.

Where the aspect ratios are large it can be difficult to conformally deposit the necessary metal layers needed for the fabrication of a metallized contact structure. Often, when the metal is deposited into a deep contact opening complete, coverage of all contact surfaces is not obtained. Also, poor step coverage is common when multiple layers of metals are used to form an inlaid metal interconnect. Typically, a high-aspect-ratio via is located at the bottom of a channel formed in an interlevel dielectric layer. Metal must uniformly fill both the channel and the underlying via opening.

The formation of an inlaid, aluminum interconnect in which aluminum metal conformally overlies all the surfaces of the highly contoured interconnect openings requires the uniform deposition of aluminum metal on all surfaces of the opening. Conventional physical vapor deposition (PVD) techniques often do not provide adequate step coverage to completely cover the interior surfaces of contact openings. Current techniques used to provide improved metal interconnects and minimize process complexity include a combination of PVD deposited metal and chemical-vapor-deposition (CVD) deposited metal. The combination is advantageous because the PVD deposition process provides a method of depositing a nucleation layer on a dielectric surface. The CVD process is an isotropic deposition process and thus possesses desirable characteristics for the filling of via opening.

Although use of a CVD process improves the step coverage in a high-aspect-ratio via, analysis of very narrow via openings reveals the presence of gaps in metal coverage at the bottom of the via openings. Accordingly, further development is necessary to provide fabrication methods for formation of low-resistance, reliable metallized interconnect structures in high-aspect-ratio contact and via openings.

SUMMARY OF THE INVENTION

In practicing the present invention there is provided a process for fabricating a metallized interconnect structure in a semiconductor device. The process enables high-aspect-ratio via structures to be uniformly filled with a metal layer, while avoiding the formation of gaps or voids within the metallized interconnect structure. In one embodiment of the invention, a semiconductor substrate is provided having an electrically conductive body. An insulating layer is provided overlying the electrically conductive body. The insulating layer contains an interconnect channel and a via opening below the interconnect channel. Aluminum is selectively deposited to at least partially fill the via opening and an interconnect adhesion layer is formed to overlie the aluminum layer and the interconnect channel. A metal layer is then blanket deposited to overlie the interconnect adhesion layer and to fill the interconnect channel. Finally, the metal layer is planarized to form an inlaid metal interconnect in the interconnect channel.

Figure 1:
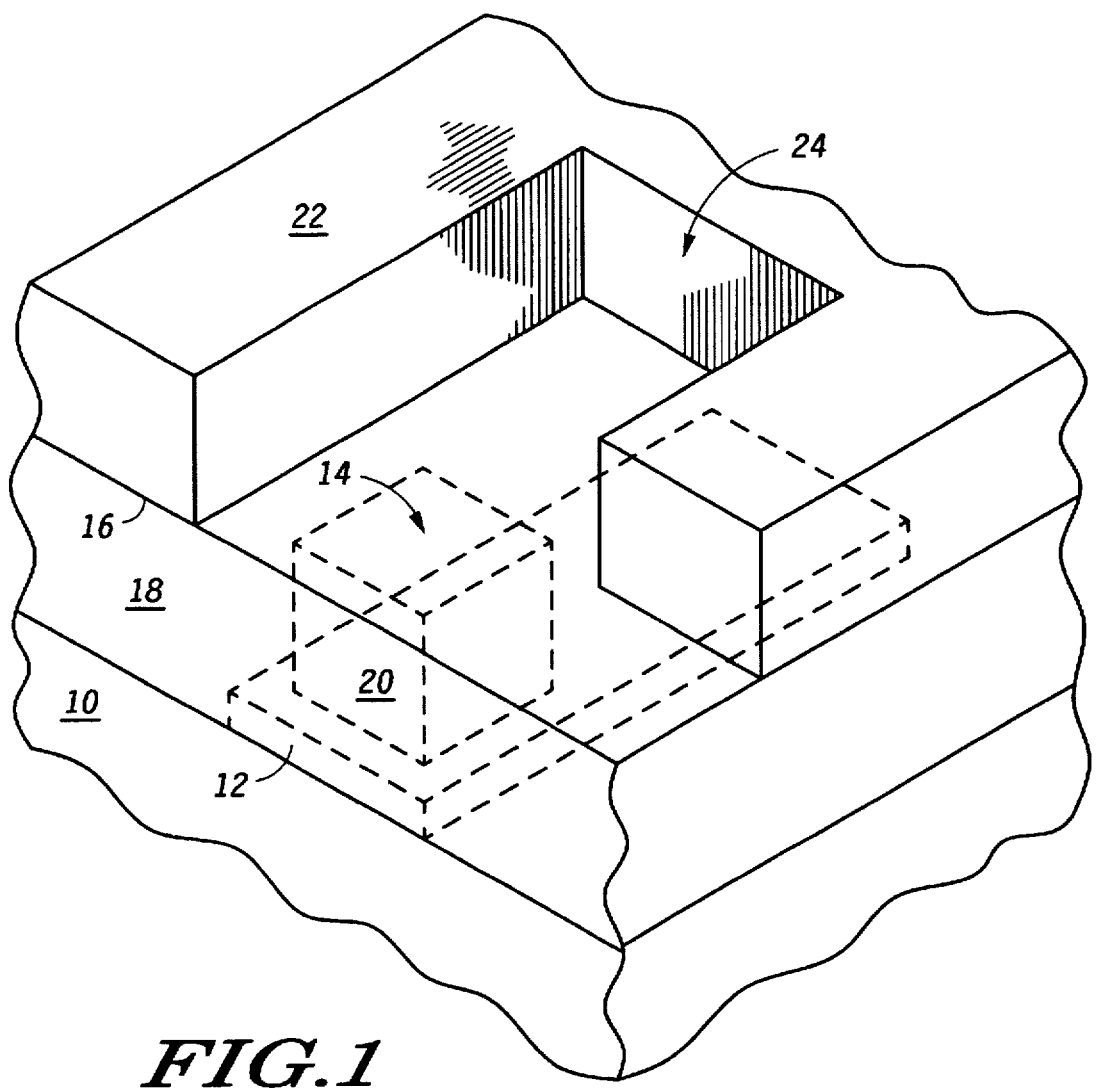
FIG. 1 illustrates, in perspective view, a inter level dielectric structure prepared for application of metal to form an interconnect structure.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention is for an interconnect fabrication process, and more particularly, for the fabrication of a metallized via structure used to couple an electrically conductive body to an overlying metal interconnect. The process of the invention specifically addresses the fabrication of a metallized interconnect structure in a high-aspect-ratio via opening within a dielectric layer. For purposes of the description of the invention, a high-aspect-ratio via opening is one in which the diameter of the opening is less than or equal to the depth of the opening. The invention further addresses the fabrication of a metallized via structure in which electrical connection is made between an underlying electrically conductive body and an overlying metal interconnect embedded in a dielectric layer. The fabrication process of the invention utilizes a selected series of processing steps to fabricate a metal structure within a high-aspect-ratio via that provide a uniform metal layer within the via. Additionally, a metallization process carried out in accordance with the invention avoids the formation of gaps or voids within the via opening.

Shown in FIG. 1, in perspective view, is a portion of a semiconductor device having a patterned interlevel dielectric layer (ILD). The ILD layer has been prepared for the formation of an inlaid metal interconnect. The structure illustrates the arrangement of a high-aspect-ratio via opening 14 formed in the bottom of an interconnect channel 24. To form a reliable interconnect, metal must be uniformly applied to all regions of both via opening 14 and interconnect channel 24. The ILD structure shown in FIG. 1 is intended to generally illustrate a particularly difficult structure for the uniform application of interconnect metal. Although the ILD preparation is typical for the formation of an inlaid interconnect, those skilled in the art will appreciate that other geometric arrangements are possible.

Referring to FIG. 1, a portion of a semiconductor substrate 10 is shown having patterned dielectric layers overlying an electrically conductive body 12. Via opening 14 extends from an upper surface 16 of a first dielectric layer 18 to a contact region 20 on the upper surface of electrically conductive body 12. A second dielectric layer 22 overlies first dielectric layer 18. Second dielectric layer 22 contains interconnect channel 24. Interconnect channel 24 exposes via opening 14 and a portion of upper surface 16 adjacent to via opening 14.

In FIG. 1, a portion of second dielectric layer 22 has been cut away to facilitate the illustration of via opening 14 within interconnect channel 24. As illustrated in FIG. 1, the length and width of via opening 14 are smaller than the corresponding length and width of interconnect channel 24. As the dimensions of via opening 14 are reduced in designs having higher degrees of device integration, the formation of reliable metallized via structures becomes more difficult. This is especially true because in the scaling of semiconductor devices to smaller dimensions, the depth of via opening 14 is not reduced concomitantly with the diameter or the cross sectional area of via opening 14.

Figure 2:
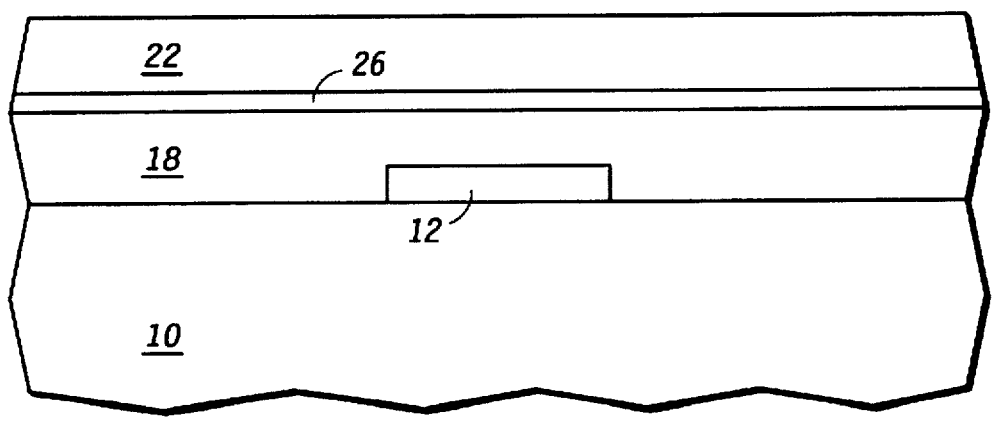
FIGS. 2–6 illustrate, in cross-section, process steps in accordance with one embodiment of the invention.

FIGS. 2–6 illustrate one embodiment of a process for fabricating a high reliability metallized interconnect structure for the ILD structure illustrated in FIG. 1. A portion of semiconductor substrate 10 having already undergone several process steps in accordance with the invention is shown in FIG. 2. Electrically conductive body 12 overlies the surface of semiconductor substrate 10 and is typically an aluminum interconnect lead overlying the substrate surface. Alternatively, electrically conductive body 12 can be a semiconductor material doped to have high electrical conductivity. For example, electrically conductive body 12 can be a polycrystalline silicon body doped with an N-type or P-type dopant. Additionally, electrically conductive body 12 can be a doped region formed within semiconductor substrate 10 and lying below dielectric layer 18.

First dielectric layer 18 is formed to overlie semiconductor substrate 10 and electrically conductive body 12. First dielectric layer 18 is preferably formed by the chemical vapor deposition of silicon dioxide using tetraethylorthosilane (TEOS) source gas. Alternatively, first dielectric layer 18 can be silicon dioxide formed by another technique, such as atmospheric deposition, and the like.

An interface layer 26 is formed to overlie first dielectric layer 18 and separates first dielectric layer 18 from second dielectric layer 22. Interface layer 26 will function as an etch stop layer in the etching process used to form via opening 14 and interconnect channel 24. Preferably, interface layer 26 is a dielectric material that is differentially etchable with respect to both first and second dielectric layers 18 and 22. For example, where first and second dielectric layers 18 and 22 are silicon dioxide, interface layer 26 can be silicon nitride or some other dielectric material capable of resisting an oxide etching process.

Figure 3:
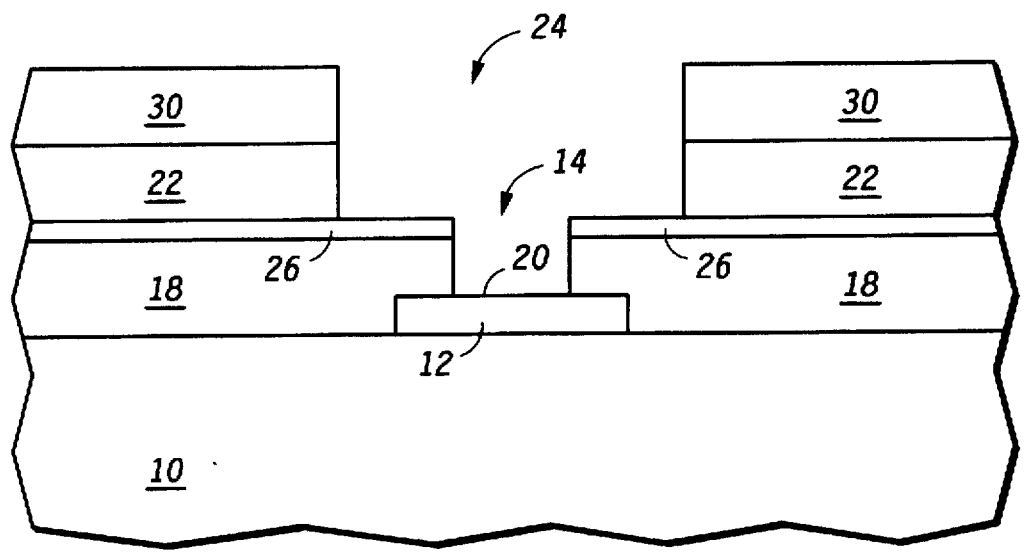

After forming the dielectric layers on semiconductor substrate 10, an etching process is carried out to form via opening 14 and interconnect channel 24, as illustrated in FIG. 3.

Figure 4:
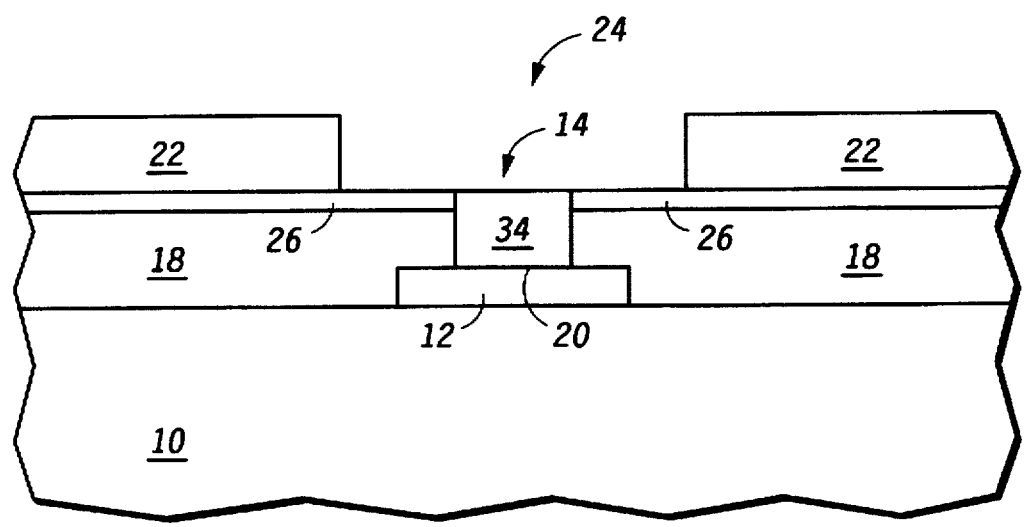

The inventive process continues with the selective deposition of a first aluminum layer 34, as shown in FIG. 4. First aluminum layer 34 is selectively deposited such that aluminum preferentially nucleates in via opening 14 at contact region 20. As the selective deposition process continues, successive layers of aluminum are deposited over the original nucleation layer, such that a thick region of aluminum is gradually built up within via opening 14. The selective deposition process is continued until first aluminum layer 34 substantially fills via opening 14.

It is important to note that the selective aluminum deposition process creates an aluminum region within via opening 14 that is free of gaps or voids and at least partially fills via opening 14 with a continuous layer of aluminum. The fabrication of a high reliability interconnect structure requires that via opening 14 contain a continuous, uniform metal layer. The process of the invention overcomes the deficiency of the prior art by insuring the creation of a uniformly distributed body of metal within the high-aspect-ratio via opening.

Figure 5:
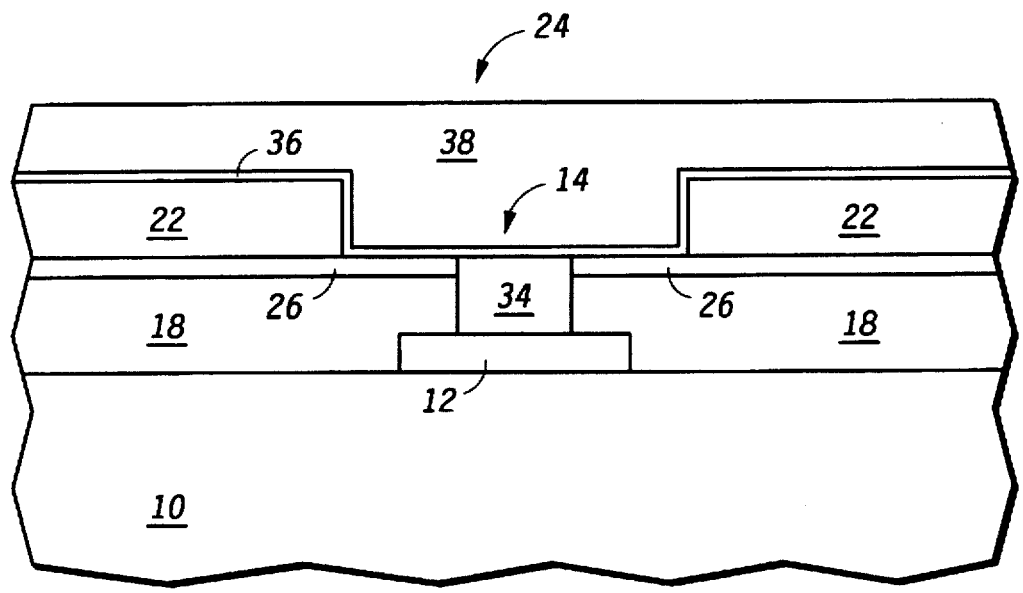

Referring to FIG. 5, after selectively depositing first aluminum layer 34, an adhesion layer 36 is formed to overlie second dielectric layer 22. Adhesion layer 36 also overlies the upper surface of first aluminum layer 34 and is conformally deposited, such that a uniformly thick adhesion layer is formed on all surfaces. Preferably, adhesion layer 36 is a composite material of titanium and titanium nitride. The composite layer can be formed by chemical vapor deposition, or by another process, such as reactive sputtering, and the like. Additionally, adhesion layer 36 can be physical vapor deposited aluminum, or titanium deposited by a collimation sputtering process. Furthermore, adhesion layer 36 can be tantalum, tantalum nitride, copper, cobalt, and ternary metal alloys such as tantalum silicon nitride, tungsten silicon nitride, and the like.

Following the formation of adhesion layer 36, a second aluminum layer 38 is formed to fill interconnect channel 24 and to overlie the upper surfaces of second dielectric layer 22. Preferably, second aluminum layer 38 is chemical vapor deposited using a metal organic precursor such as dimethylaluminum hydride (DMAH) entrained in a carrier gas. Preferably the carrier gas can be helium or hydrogen. The chemical vapor deposition process using a metal organic precursor provides an aluminum layer having excellent step coverage over the surface of semiconductor substrate 10. The chemical vapor deposited aluminum completely fills interconnect channel 24 without leaving any voids or gaps at the corners of interconnect channel 24.

During the metal organic chemical vapor deposition process, aluminum non-selectively deposits on all exposed surfaces of semiconductor substrate 10 and conformally fills interconnect channel 24. The combination of selectively deposited aluminum to fill a high-aspect-ratio via opening, such as via opening 14, in combination with a conformal chemical vapor deposition process to deposit aluminum in an interconnect channel results in a high reliability metallized interconnect structure. The combination of deposition processes used in the present invention produces uniformly distributed aluminum within both via opening 14 and interconnect channel 24. Accordingly, the present invention can be employed to uniformly fill high-aspect-ratio via openings underlying larger openings, such as interconnect channels and other kinds of patterned structures within an interlevel dielectric material.

Figure 6:
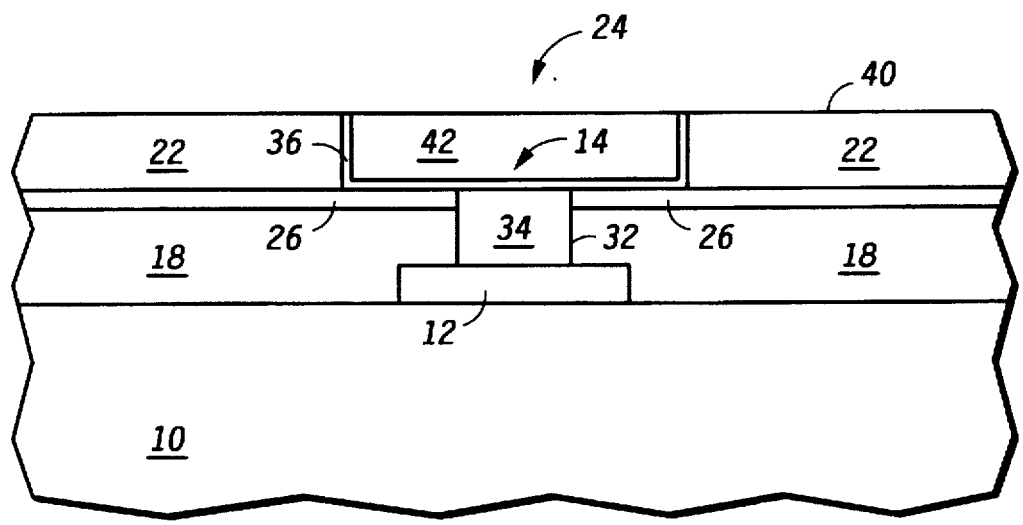

As illustrated in FIG. 6, after forming second aluminum layer 38, an inlaid metal interconnect is formed by planarizing semiconductor substrate 10 to form a planar surface 40, and to leave an inlaid interconnect 42 in interconnect channel 24. Adhesion layer 36 underlies inlaid interconnect 42 and separates first aluminum layer 34 from inlaid interconnect 42. In this manner, a strong adhesive force is provided at all interfaces of inlaid interconnect 42 with underlying metal surfaces.

The planarization process removes portions of second aluminum layer 38 overlying the upper surface of second dielectric layer 22. Additionally, the planarization process removes portions of adhesion layer 36 overlying the upper surface of second dielectric layer 22. Preferably, a chemical-mechanical-polishing (CMP) process is used to form planar surface 40. In the CMP process, a force is applied to the substrate and an abrasive slurry, dispensed upon a polishing pad, grinds layers of material away.

Although the process of the invention has been illustrated through the fabrication of an inlaid interconnect structure, those skilled in the art will recognize that the process of the invention can be applied to other structural arrangements. For example, rather than an interconnect channel, the opening formed in second dielectric layer 22 can be of similar dimensions as via opening 14. Additionally, rather than a multi-layered interlevel dielectric structure, the dielectric material can be a single, continuous region of dielectric material with a single opening penetrating the dielectric material.

Thus it is apparent that there has been provided, in accordance with the invention, a process for fabricating a metallized interconnect structure in a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different metal interconnect alloys can be used, such as aluminum copper, aluminum silicon aluminum silicon copper, and the like. It is therefore intended to include within the invention all such variations and modifications as fall within the scope of the appended claims and equivalents thereof.

We claim:

1. A process for fabricating a semiconductor device comprising the steps of:

providing a semiconductor substrate having an electrically conductive body;

forming an multi-layered insulator overlying the electrically conductive body, wherein the multi-layered insulator includes a first dielectric layer overlying the semiconductor substrate and the electrically conductive body, an interface layer overlying the first dielectric layer, and a second dielectric layer overlying the interface layer;

forming an opening in the multi-layered insulator exposing a contact portion of the electrically conductive body, the opening having a via portion extending from the contact portion of the electrically conductive body to an upper surface of the interface layer, and an interconnect portion extending from the interface layer to an upper surface of the second dielectric layer;

selectively depositing a first aluminum layer onto the contact portion of the electrically conductive body and at least partially filling the via portion of the opening, wherein the step of selectively depositing is carried out after forming the via portion and the interconnect portion of the opening;

forming a metal adhesion layer overlying the first aluminum layer and the interconnect portion; and blanket depositing a second aluminum layer onto the metal adhesion layer and filling the interconnect portion of the opening.

2. The process of claim 1, wherein the step of selectively depositing a first aluminum layer comprises chemical vapor deposition using dimethyl aluminum hydride entrained in a carrier gas.

3. The process of claim 2, wherein the carrier gas is selected from the group consisting of helium and hydrogen.

4. The process of claim 1, wherein the steps of selectively depositing the first aluminum layer, forming a metal adhesion layer, and blanket depositing the second aluminum layer are sequentially carried out in a process apparatus maintained under an inert atmosphere.

5. The process of claim 1, wherein the step of providing an electrically conductive body comprises forming a doped region in the semiconductor substrate.

6. The process of claim 1, wherein the step of providing an electrically conductive body comprises forming a doped polycrystalline silicon region on the semiconductor substrate.

7. A process for fabricating a semiconductor device comprising the steps of:

providing a semiconductor substrate having an electrically conductive body;

forming an insulating layer overlying the electrically conductive body, wherein the insulating layer contains an interconnect channel and a via opening below the interconnect channel, the via opening having a wall surface extending from interconnect channel to a contact portion of the electrically conductive body, the interconnect channel having a wall surface extending from an upper surface of the insulating layer to the via opening;

selectively depositing an aluminum layer to at least partially fill the via opening, wherein the step of selectively depositing is carried out after forming the via opening and the interconnect channel of the opening;

forming an interconnect adhesion layer overlying the aluminum layer and at least the wall surface of the interconnect channel;

blanket depositing a metal layer overlying the interconnect adhesion layer and filling the interconnect channel; and planarizing the metal layer to form an inlaid metal interconnect in the interconnect channel.

8. The process of claim 7, wherein the step of selectively depositing the aluminum layer comprises chemical vapor deposition using dimethyl aluminum hydride entrained in a carrier gas.

9. The process of claim 7, wherein the carrier gas is selected from the group consisting of helium and hydrogen.

10. The process of claim 7, wherein the steps of selectively depositing an aluminum layer, forming an interconnect adhesion layer, and blanket depositing the metal layer are sequentially carried out in a process apparatus maintained under an inert atmosphere.

11. The process of claim 7, wherein the step of providing an electrically conductive body comprises forming a doped region in the semiconductor substrate.

12. The process of claim 7, wherein the step of providing an electrically conductive body comprises forming a doped polycrystalline silicon region on the semiconductor substrate.

13. A process for fabricating a semiconductor device comprising the steps of:

provyding a semiconductor substrate having an electrically conductive body thereon;

forming a first insulating layer overlying the electrically conductive body and the semiconductor substrate;

forming an interface layer overlying the first insulating layer;

forming a second insulating layer overlying the interface layer;

etching the second insulating layer, interface layer, and the first insulating layer, to form first and second openings therein, wherein the first opening has a wall surface extending from a contact portion of the electrically conductive body to an upper surface of the first insulating layer, and wherein the second opening has a wall surface extending from the interface layer to an upper surface of the second insulating layer;

selectively depositing an aluminum layer using the contact portion as a nucleation site and at least partially filling the first opening, wherein the step of selectively depositing is carried out after forming the first opening and the second opening;

forming an adhesion layer overlying the aluminum layer and at least the wall surface of the second opening;

depositing a blanket metal layer overlying the second adhesion layer and filling the second opening; and planarizing the blanket metal layer to form an inlaid metal interconnect in the second opening.

14. The process of claim 13, wherein the step of forming the adhesion layers comprises forming a composite metal layer including a titanium layer and a sputtered aluminum layer.

15. The process of claim 13, wherein the step of planarizing the blanket metal layer comprises chemical-mechanical-polishing.

16. The process of claim 13, wherein the step of selectively depositing a first aluminum layer comprises chemical vapor deposition using dimethyl aluminum hydride entrained in a carrier gas.

* * * * *